(12) United States Patent
Li et al.

(10) Patent No.: US 11,372,558 B2
(45) Date of Patent: Jun. 28, 2022

(54) METHOD FOR ACCESSING ONE-TIME-PROGRAMMABLE MEMORY AND ASSOCIATED CIRCUITRY

(71) Applicant: Realtek Semiconductor Corp., HsinChu (TW)

(72) Inventors: Zhaoming Li, Suzhou (CN); Jieyu Wang, Suzhou (CN); Zuohui Peng, Suzhou (CN)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/192,911

(22) Filed: Mar. 5, 2021

(65) Prior Publication Data

US 2021/0342076 A1   Nov. 4, 2021

(30) Foreign Application Priority Data

Apr. 29, 2020   (CN) .......................... 202010356789.X

(51) Int. Cl.
*G06F 3/06*   (2006.01)
(52) U.S. Cl.
CPC .......... *G06F 3/0622* (2013.01); *G06F 3/0655* (2013.01); *G06F 3/0679* (2013.01)
(58) Field of Classification Search
CPC .... G06F 3/0622; G06F 3/0632; G06F 3/0634; G06F 3/0637; G06F 3/0655; G06F 3/0679

USPC ................. 711/102, 103, 152, 154, 156, 163
See application file for complete search history.

(56) References Cited

U.S. PATENT DOCUMENTS

| | | | |
|---|---|---|---|
| 8,589,617 B2* | 11/2013 | Maeda .................. | G06F 3/0643 711/103 |
| 2009/0217058 A1 | 8/2009 | Obereiner | |
| 2011/0185131 A1* | 7/2011 | Hayashi ................. | H04N 5/772 711/154 |
| 2017/0090909 A1* | 3/2017 | Guo ........................ | G06F 21/57 |
| 2018/0210970 A1 | 7/2018 | Marukame | |
| 2020/0341659 A1* | 10/2020 | Chauhan ................. | G06F 3/065 |

FOREIGN PATENT DOCUMENTS

CN              103187095 A         7/2013

* cited by examiner

*Primary Examiner* — Gary J Portka
(74) *Attorney, Agent, or Firm* — Winston Hsu

(57) ABSTRACT

The present invention provides a circuitry including a processor, a one-time programmable memory and an access control circuit. The one-time programmable memory includes a first area and a first access control data, wherein the first access control data is used to indicate whether the first area can be written or read by the processor. When the processor writes or reads the first area through the access control circuit, the access control circuit determines whether to write or read the first area according to the first access control data, and the access control circuit determines what kind of data for sending back to the processor.

8 Claims, 4 Drawing Sheets

METHOD FOR ACCESSING ONE-TIME-PROGRAMMABLE MEMORY AND ASSOCIATED CIRCUITRY

BACKGROUND OF THE INVENTION

1. Field of the Invention

The present invention relates to a method for accessing a one-time-programmable memory.

2. Description of the Prior Art

An electronic fuse (eFuse) is a one-time programmable memory, the default bit is "1", and once the eFuse is programmed to "0", it cannot be programmed as "1". The eFuse module can usually be used to store a variety of data. For example, the eFuse module can be used to store calibration information and configuration information during a mass production stage of electronic products to improve a yield of the chips, wherein the calibration information and the configuration information are not confidential. The eFuse module can also store keys related to chip security, such as the keys used to encrypt and decrypt a flash memory. These keys are confidential data, that is, if these keys are not protected, the keys will be stolen or modified.

Since the eFuse module may store data with different levels of confidentiality, how to design a method to access the eFuse module to avoid the theft or tampering of confidential data, and at the same time to take into account non-confidential calibration information and configuration information can be used efficiently, is an important issue.

SUMMARY OF THE INVENTION

It is therefore an objective of the present invention to provide a method for accessing a one-time-programmable memory, which can efficiently access the one-time programmable memory while taking into account security, to solve the above-mentioned problems.

In one embodiment of the present invention, a circuitry comprising a processor, a one-time programmable memory and an access control circuit is disclosed. The one-time programmable memory comprises a first area and a first access control data, wherein the first access control data is used to indicate whether the first area can be written or read by the processor. When the processor writes or reads the first area through the access control circuit, the access control circuit determines whether to write or read the first area according to the first access control data, and the access control circuit determines what kind of data to send back to the processor accordingly.

In another embodiment of the present invention, a method for accessing a one-time programmable memory is disclosed. The method comprises the steps of: receiving an access command from a processor, wherein the access command instructs to access the one-time programmable memory; and refer to an access control data recorded in the one-time programmable memory to determine whether to write or read the one-time programmable memory, and determining what kind of data to send back to the processor accordingly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
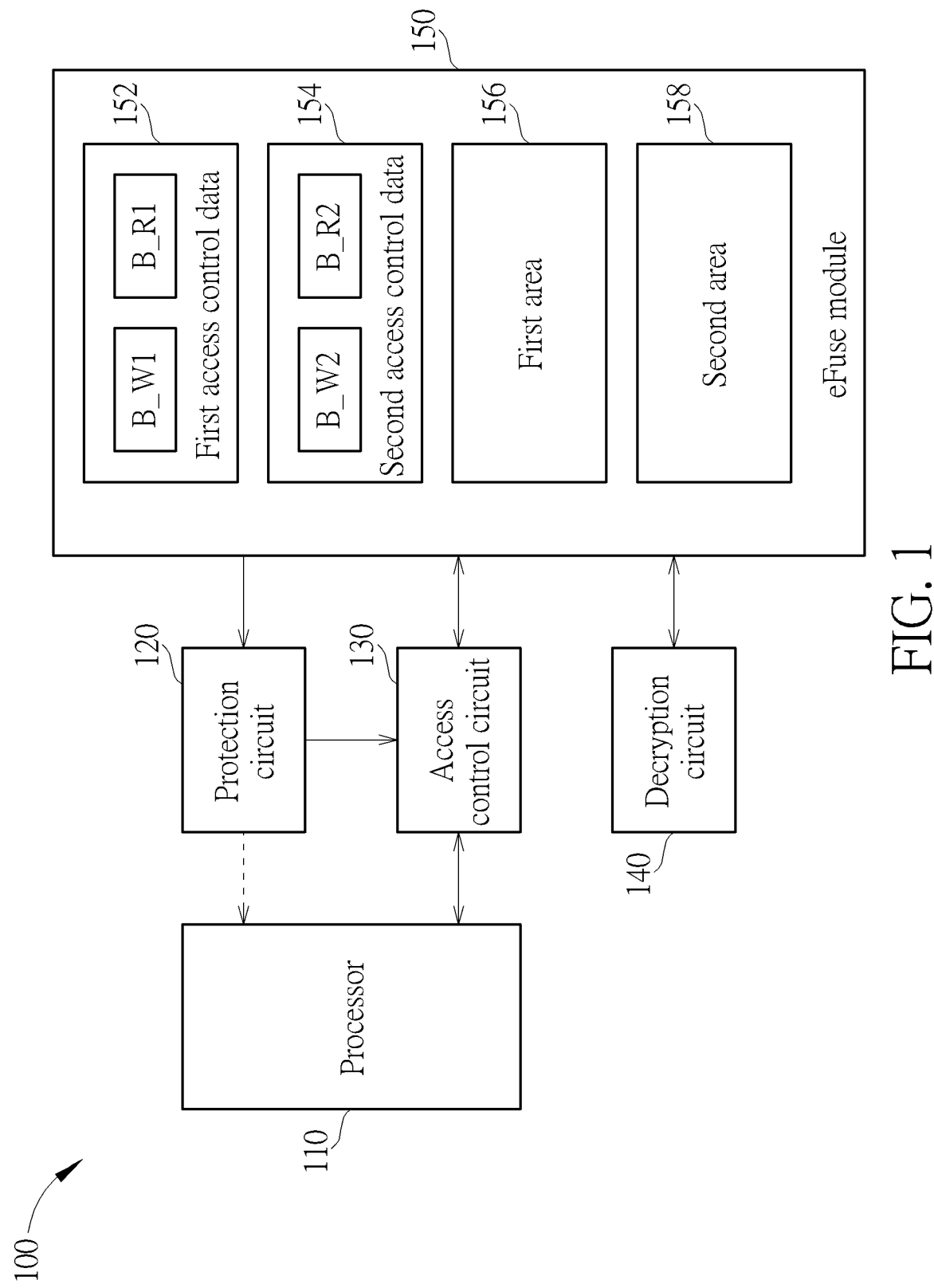
FIG. 1 is a diagram illustrating a circuitry according to one embodiment of the present invention.

FIG. 1 is a diagram illustrating a circuitry 100 according to one embodiment of the present invention. As shown in FIG. 1, the circuitry 100 comprises a processor 110, a protection circuit 120, an access control circuit 130, a decryption circuit 140 and a one-time programmable memory (in this embodiment, an eFuse module 150 is used as an example). The eFuse module 150 comprises a first access control data 152, a second access control data 154, a first area 156 and a second area 158. In this embodiment, the first access control data 152 and the second access control data 154 can be stored in a specific area within the eFuse module 150, wherein the specific area can be identified and read by the protection circuit 120 or the access control circuit 130. For example, the specific area may be within the first area 156, the second area 158 or other areas.

The circuitry 100 is used in an electronic device, and the processor 110 may be a central processing unit (CPU) that is used to execute a plurality of program codes to control the operation of the electronic device. The first access control data 152 is used to indicate whether the first area 156 can be written and/or read by the processor 110 (i.e., software control), and the second access control data 154 is used to indicate whether the second area 158 can be written and/or read by the processor 110. In this embodiment, the first access control data 152 includes a write control bit B_W1 and a read control bit B_R1, wherein when the write control bit B_W1 has a first logical value (for example, the logical value "1"), it means that the first area 156 can be written by the processor 110; and when the write control bit B_W1 has a second logical value (for example, the logical value "0"), it means that the first area 156 is not allowed to be written by the processor 110. When the read control bit B_R1 has the first logical value, it means that the first area 156 can be read by the processor 110; and when the read control bit B_R1 has the second logical value, it means that the first area 156 is not allowed to be read by the processor 110. Similarly, the second access control data 154 includes a write control bit B_W2 and a read control bit B_R2, wherein when the write control bit B_W2 has the first logical value, it means that the second area 158 can be written by the processor 110; and when the write control bit B_W2 has the second logical value, it means that the second area 158 is not allowed to be written by the processor 110. When the read control bit B_R2 has the first logical value, it means that the second area 158 can be read by the processor 110; and when the read control bit B_R2 has the second logical value, it means that the second area 158 is not allowed to be read by the processor 110.

In the operation of the circuitry 100, after the circuitry 100 is powered on and initialized, the protection circuit 120 reads the first access control data 152 and the second access control data 154 from the eFuse module 150, and first access control data 152 and the second access control data 154 are temporarily in the protection circuit 120. In one embodiment, the processor 110 may also obtain the first access control data 152 and the second access control data 154 from the protection circuit 120. Then, when the processor 110 needs to write or read the eFuse module 150, the processor 110 transmits a write command or a read command to the access control circuit 130, and the access control circuit 130 refers to the area that the processor 110 needs to access, for example the first area 156, to refer to the first access control data 152 to determine whether to write or read the first area 156, and to determine to send which data to the processor. Specifically, refer to FIG. 2 which shows a flowchart of the processor 110 trying to write data to the first area 156 of the eFuse module 150 according to one embodiment of the present invention. In Step 200, the flow starts and the circuitry 100 completes the initialization operation. In Step 202, the processor 110 transmits a write command and data to the access control circuit 130. In this embodiment, it is assumed that the write command includes an address located in the first area 156, that is, the processor 110 intends to write the data to into the first area 156. In Step 204, the access control circuit 130 obtains the write control bit B_W1 from the protection circuit 120, and the access control circuit 130 determines whether the write control bit B_W1 is equal to the logical value "0", if yes, the flow enters Step 206; if not, the flow enters Step 208. In Step 206, because the write control bit B_W1 having the logical value "0" indicates that the first area 156 is not allowed to be written by the processor 110, the access control circuit 130 directly discards the data from the processor 110, that is, the data will not be written to the first area 156. In step 208, because the write control bit B_W1 having the logical value "1" indicates that the first area 156 can be written by the processor 110, the access control circuit 130 will write the data to the first area 156. In Step 210, the flow finishes, and the access control circuit 130 returns a message indicating writing success or wiring failure to the processor 110.

Figure 3:
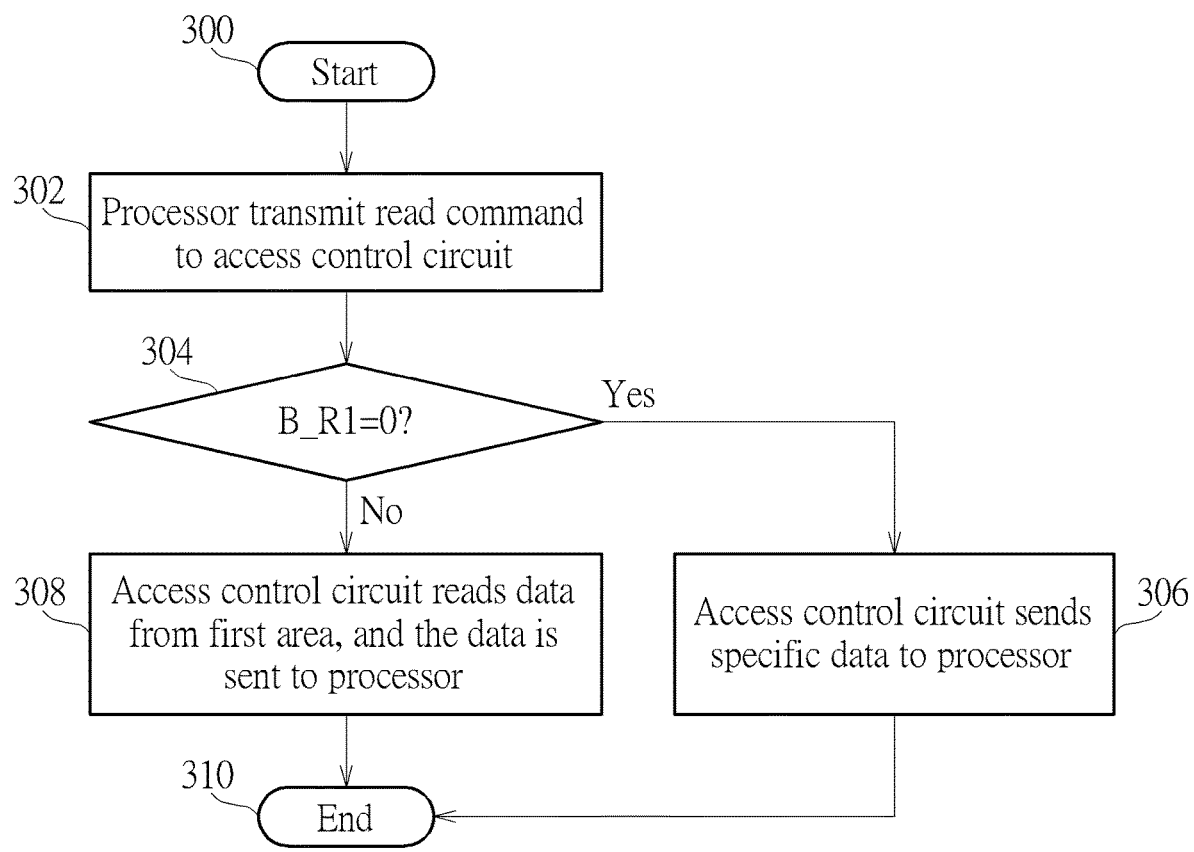
FIG. 3 shows a flowchart of the processor trying to read the data stored in the first area of the eFuse module.

FIG. 3 shows a flowchart of the processor 110 trying to read the data stored in the first area 156 of the eFuse module 150. In Step 300, the flow starts and the circuitry 100 completes the initialization operation. In Step 302, the processor 110 transmits a read command to the access control circuit 130. In this embodiment, it is assumed that the read command includes an address located in the first area 156, that is, the processor 110 intends to read data from the first area 156. In Step 304, the access control circuit 130 obtains the read control bit B_R1 from the protection circuit 120, and the access control circuit 130 determines whether the read control bit B_R1 is equal to the logical value "0", if yes, the flow enters Step 306; if not, the flow enters Step 308. In Step 306, because the read control bit B_R1 having the logical value "0" indicates that the first area 156 is not allowed to be read by the processor 110, the access control circuit 130 will send specific data with a fixed value to the processor 110, that is, the access control circuit 130 does not read the first area 156 and directly sends dummy data to the processor 110. In step 308, because the read control bit B_R1 having the logical value "1" indicates that the first area 156 can be read by the processor 110, the access control circuit 130 will read the data in first area 156, and the access control circuit 130 sends the data read from the first area 156 to the processor 110. In Step 310, the flow finishes.

In the above embodiment, the default bit of each eFuse in the eFuse module 150 is "1", and once the eFuse is programmed to "0", it cannot be programmed back to "1". Therefore, by setting the write control bit B_W1 having the logical value "0" to indicate that the first area 156 does not allow data writing by the processor 110, and by setting the read control bit B_R1 having the logical value "0" to indicate that the first area 156 is not allowed to be read by the processor 110, these write control bit B_W1 and read control bit B_R1 that are set to have the logical value "0" can be prevented from being changed to the logical value "1" that allows the processor 110 to write and read, so as to enhance the safety of the circuitry 100.

Figure 2:
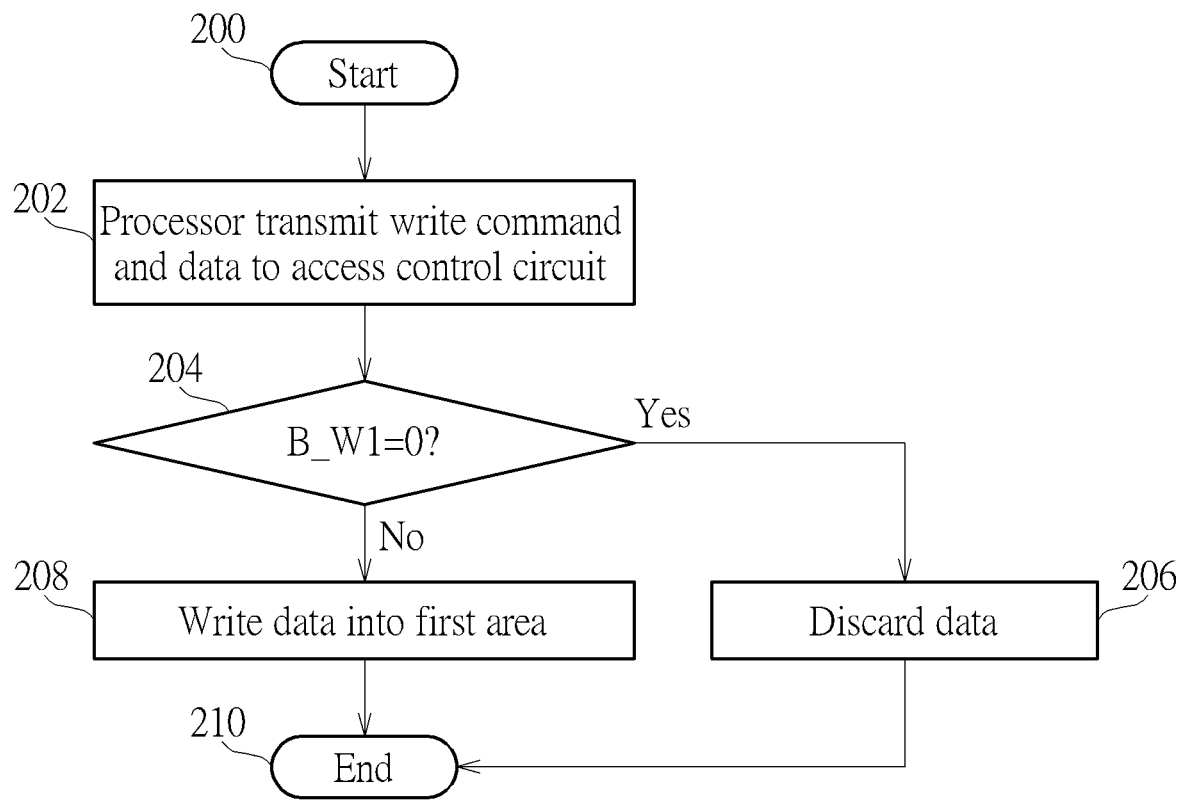
FIG. 2 shows a flowchart of a processor trying to write data to a first area of an eFuse module.

The above embodiments in FIG. 2 and FIG. 3 are described using the first area 156, and the same implementation can also be applied to the second area 158.

In an embodiment, the first area 156 and the second area 158 can be used to store data with different security levels. For example, the first area 156 can be used to store keys related to chip security, and the second area 158 can be used to store calibration information and configuration information of electronic products. At this time, the write control bit B_W1 and the read control bit B_R1 corresponding to the first area 156 can be set to "0" to avoid access by the processor 110, and the write control bit B_W2 and the read control bit B_R2 corresponding to the second area 158 can be set to "1" to allow the processor 110 to access to improve the system efficiency. In addition, in one embodiment, the first area 156 that cannot be accessed by the processor 110 can be written or read through the decryption circuit 140, and the decryption circuit 140 can communicate with another circuitry (e.g. a flash memory controller), wherein the another circuitry and the processor 110 are arranged separately (i.e. the processor 110 cannot obtain the data of the first area 156 from the another circuitry).

As mentioned above, since the first area 156 and the second area 158 in the eFuse module 150 are protected by the corresponding first access control data 152 and the second access control data 154, respectively, and the first area 156 and the second area 158 can be flexibly selected for write protection only, read protection only, or both write and read protection. Therefore, the operation of the circuitry 100 can be more flexible and simple under the condition of safety protection.

Figure 4:
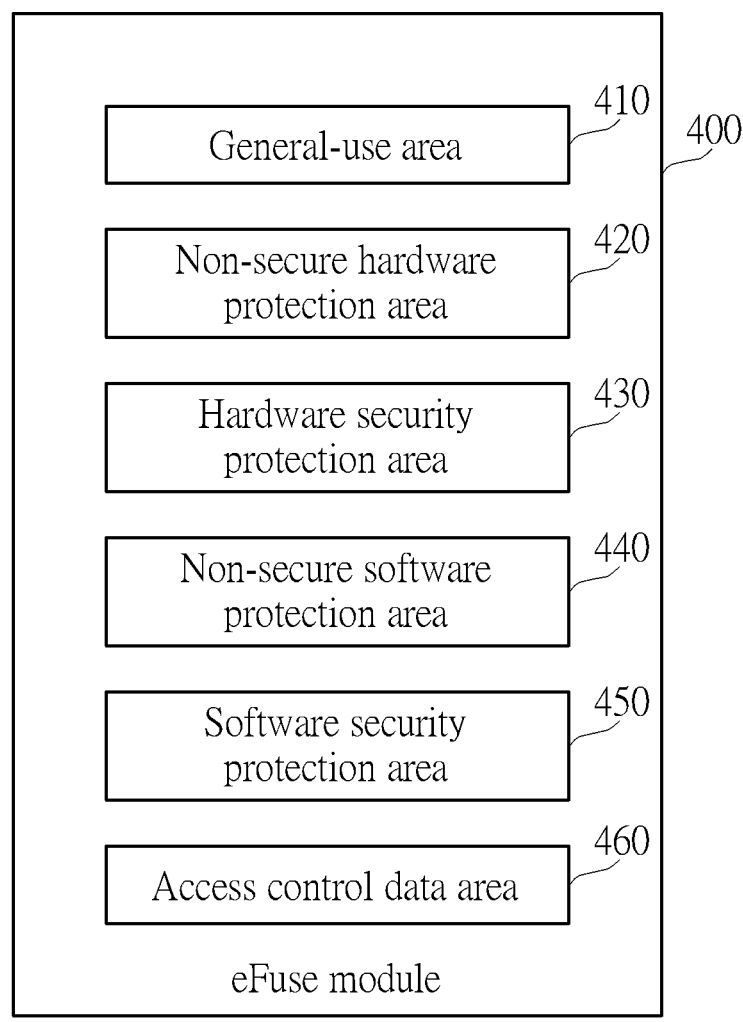
FIG. 4 is a diagram of the eFuse module according to one embodiment of the present invention.

On the other hand, the area configuration in the eFuse module 150 shown in FIG. 1 is only for illustration, and FIG. 4 shows a diagram of an eFuse module 400 according to an embodiment of the present invention, which can be used to replace the eFuse module 150.

As shown in FIG. 4, the eFuse module 400 includes a general-use area 410, a non-secure hardware protection area 420, a hardware security protection area 430, a non-secure software protection area 440, a software security protection area 450 and an access control data area 460. In the embodiment shown in FIG. 4, the general-use area 410 does not correspond to any write control bits and read control bits, the non-secure hardware protection area 420 has corresponding write control bits and read control bits, and the hardware security protection area 430 has corresponding write control bit and read control bit, the non-secure software protection area 440 only has corresponding write control bit, the software security protection area 450 only has the corresponding write control bit, and the above-mentioned write control bits and read control bits are stored in the access control data area 460.

The general-use area 410 stores general information, and because it does not have any write control bit and read control bit, the processor 110 or other hardware can directly access the general-use area 410.

The non-secure hardware protection area 420 can be used to store a key used for encryption or decryption or a password that needs to be verified before accessing the chip. When the read control bit corresponding to the non-secure hardware protection area 420 is modified to the logical value "0", the processor 110 can no longer read this area to avoid the theft of chip information; and when the write control bit corresponding to the non-secure hardware protection area 420 is modified to the logical value "0", the processor 110 can no longer perform a write operation to effectively prevent the content of the non-secure hardware protection area 420 from being modified.

The hardware security protection area 430 stores keys or passwords that can only be accessed by software and hardware with security attributes, and the software/hardware without the security attributes cannot access the hardware security protection area 430. The key in the hardware security protection area 430 can be automatically read by a hardware encryption and decryption engine with security attributes, and the key stored therein can be used to encrypt more important information. In addition, when the read control bit corresponding to the hardware security protection area 430 is modified to the logical value "0", the software with the security attributes can no longer read this area to avoid the theft of chip information; and when the write control bit corresponding to the hardware security protection area 430 is modified to the logical value "0", the software with the security attributes can no longer perform a write operation to effectively prevent the content of the hardware security protection area 430 from being modified.

The non-secure software protection area 440 stores the key that needs to be read by the software (i.e. the processor 110). The software has more flexibility in automatic reading and decryption than hardware encryption and decryption engine, and the software can specify the encryption and decryption method or a verification strategy. Since the above function requires software to read the key of the non-secure software protected area 440, the non-secure software protected area 440 is not designed to have the corresponding read control bit. After the write control bit corresponding to the non-secure software protected area 440 is modified to the logical value "0", the processor 110 can no longer write the key in the non-secure software protected area 440, which can effectively prevent the key from being modified.

The software security protection area 450 stores the key that needs to be read by the software with security attributes. The software has more flexibility in automatic reading and decryption than hardware encryption and decryption engine, and the software with security attributes can specify the encryption and decryption method or a verification strategy. Since the above function requires software to read the key of the software security protection area 450, the software security protection area 450 is not designed to have the corresponding read control bit. After the write control bit corresponding to the software security protection area 450 is modified to the logical value "0", the processor 110 can no longer write the key in the software security protection area 450, which can effectively prevent the key from being modified.

Briefly summarized, in the method of accessing a one-time programmable memory and related circuits of the present invention, by setting the access control data (that is, write control bits or read control bits) for multiple areas in the eFuse module, the eFuse module can be accessed efficiently while taking into account security.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuitry, comprising:
   a processor;
   a one-time programmable memory comprising at least a first area and storing a first access control data, wherein the first access control data is used to indicate whether the first area can be written or read by the processor;
   an access control circuit, coupled between the processor and the one-time programmable memory, wherein when the processor transmits a write command or a read command for accessing the first area through the access control circuit, the access control circuit determines whether to write or read the first area according to the first access control data, and the access control circuit determines what kind of data to send back to the processor accordingly; and
   a decryption circuit, coupled to the one-time programmable memory, wherein when the first access control data indicates that the first area is not allowed to be written and/or read by the processor, the first area is only allowed to be written and/or read by the decryption circuit.

2. The circuitry of claim 1, wherein the first access control data comprises a read control bit; and when the processor intends to read the first area through the access control circuit, if the read control bit has a first logical value, the access control circuit reads data from the first area and transmits the data to the processor; and if the read control bit has a second logical value, the access control circuit does not read the data from the first area.

3. The circuitry of claim 2, wherein if the read control bit has the second logical value, the access control circuit sends specific data to the processor.

4. The circuitry of claim 1, wherein the first access control data comprises a write control bit; and when the processor intends to write data to the first area through the access control circuit, if the write control bit has a first logical value, the access control circuit writes the data to the first area; and if the write control bit has a second logical value, the access control circuit discards the data, without writing the data into the first area.

5. The circuitry of claim 1, wherein the one-time programmable memory further comprises a second area and second access control data, the second access control data is used to indicate whether the second area can be written and/or read by the processor, and the first access control data is not exactly the same as the second access control data.

6. The circuitry of claim 1, further comprising:
   a protection circuit, wherein when the circuitry is powered on, the protection circuit reads the first access control data from the first area, and the first access control data is temporarily in the protection circuit;
   wherein when the processor writes or reads the first area through the access control circuit, the access control circuit determines whether to write or read the first area according to the first access control data temporarily stored in the protection circuit, and the access control circuit determines what kind of data to send back to the processor accordingly.

7. The circuitry of claim 1, wherein when the first access control data indicates that the first area is not allowed to be written and/or read by the processor, the first access control data cannot be changed to allow the processor to write and/or read the first area.

8. The circuitry of claim 1, wherein the one-time-programmable memory is an electronic fuse (eFuse).

\* \* \* \* \*